(12) United States Patent
Blake

(10) Patent No.: US 6,188,189 B1
(45) Date of Patent: *Feb. 13, 2001

(54) FAN SPEED CONTROL SYSTEM

(75) Inventor: John Blake, Raheen (IE)

(73) Assignee: Analog Devices, Inc., Norwood, MA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/470,800

(22) Filed: Dec. 23, 1999

(51) Int. Cl.⁷ .................................................. F24F 7/00
(52) U.S. Cl. ............................................. 318/471; 318/268
(58) Field of Search .......................... 318/34, 268, 272, 318/471, 472, 473; 388/934

(56) References Cited

U.S. PATENT DOCUMENTS

| | | | |
|---|---|---|---|
| 4,817,865 | 4/1989 | Wray | 236/49.5 |
| 5,057,968 | 10/1991 | Morrison | 361/385 |
| 5,102,040 | 4/1992 | Harvey | 236/49.3 |
| 5,467,607 | 11/1995 | Harvey | 62/186 |
| 5,484,012 | 1/1996 | Hiratsuka | 165/40 |
| 5,714,938 | 2/1998 | Schwabl | 340/584 |
| 5,731,954 | 3/1998 | Cheon | 361/699 |
| 5,831,525 | 11/1998 | Harvey | 340/507 |
| 6,104,003 | * 8/2000 | Jones | 219/400 |

OTHER PUBLICATIONS

"PWM Fan Speed Controller with Fault Detection", Telcom Semiconductor, Inc., Mar. 11,1998, pp.1–14.
"MIC502 –Fan Management IC, Advance Information", Micrel, Inc., Dec.1998, pp.1–16.

* cited by examiner

Primary Examiner—Bentsu Ro
(74) Attorney, Agent, or Firm—Wolf, Greenfield & Sacks, P.C.

(57) ABSTRACT

A fan speed control system for an electronic equipment enclosure comprises means for determining temperature at a plurality of locations within the enclosure, means for determining operating parameters for the fan control system, means for setting operating speed of at least one cooling fan, and means for exchanging information signals relating to fan speed control system operation with an external controller. A method is also provided for controlling fan speed for an electronic equipment enclosure comprising the steps of determining temperature at a plurality of locations within the enclosure, determining operating parameters for the fan control system, setting operating speed of at least one cooling fan, and exchanging information signals relating to fan speed control system operation with an external controller.

23 Claims, 8 Drawing Sheets

| 3 LSBs of ADC | Ideal Ratio R2/(R1+R2) | R1 | R2 | Actual R2/(R1+R2) | Error | TMIN | Fans Installed | Address |
|---|---|---|---|---|---|---|---|---|
| 111 | n/a | 0 | ∞ | 1 | 0 | Disabled | 2 | 0101111 |
| 110 | 0.8125 | 18k | 82k | 0.82 | 0.75% | 48°C | 2 | 0101110 |
| 101 | 0.6875 | 22k | 47k | 0.6812 | -0.63% | 40°C | 2 | 0101101 |
| 100 | 0.5625 | 12k | 15k | 0.5556 | -0.69% | 32°C | 1 | 0101100 |
| 011 | 0.4375 | 15k | 12k | 0.4444 | 0.69% | 32°C | 1 | 0101011 |
| 010 | 0.3125 | 47k | 22k | 0.3188 | 0.63% | 40°C | 1 | 0101010 |
| 001 | 0.1875 | 82k | 18k | 0.18 | -0.75% | 48°C | 1 | 0101001 |
| 000 | n/a | ∞ | 0 | 0 | 0 | Disabled | 1 | 0101000 |

FIG. 3

FAN SPEED CONTROL SYSTEM

FIELD OF THE INVENTION

This invention relates generally to fan speed control and in particular to a fan speed control system for electronic equipment enclosures, and is more particularly directed toward a fan speed control system that communicates with an external processor resource while retaining some autonomy, and utilizes pulse width modulation to maintain a predetermined relationship between fan speed and equipment temperature.

BACKGROUND OF THE INVENTION

Electronic equipment always generates heat, largely as a consequence of the fact that no electronic system is one hundred percent efficient. Some of the input power of the system must, of necessity, be dissipated as heat.

With the advent of the semiconductor, it became possible to construct electronic systems that operate at low power consumption. These early solid-state electronic systems generally exhibited low overall power consumption, and, consequently, even at low efficiency, there was little heat. Only applications requiring high power to be generated somewhere within the equipment, such as radio transmitter implementations, had hot spots within the equipment requiring the use of heat sinks and/or cooling fans.

Early computers were virtually room-size because of the need for massive numbers of switching circuits that could only be provided through the use of vacuum tubes. Since vacuum tubes were inherently inefficient, much of the size and expense of early computer systems is attributable to power supplies and cooling systems. As the transistor, and eventually the integrated circuit, became more ubiquitous, the size and power requirements of computer systems decreased dramatically.

Because microprocessor systems are so small and use so little power, availability of portable, battery-powered systems has grown by leaps and bounds. But many new application programs require large amounts of processing power, and high-speed operation of new, sub-micron geometries requires the expenditure of considerable amounts of power.

This has not discouraged the development of faster processors or portable systems, however. Fixed equipment that is not dependent upon batteries for power can tolerate the additional power consumption that cooling fans require, and, because of the recent development of batteries with very high capacities, even in small packages, portable computing equipment can take advantage of new, more powerful processing technologies by conceding the need for cooling fans and budgeting power accordingly.

Of course, even the best of the modern battery packs do not have unlimited power, and there are environmental standards associated with acoustic noise that is produced by fans running at high speed. In many forms of high performance equipment, such as high-speed, high-capacity file servers, multiple processors generate sufficient heat that banks of cooling fans, as many as eight or sixteen, for example, can be required to achieve acceptable cooling. Acoustic concerns make it desirable to run the fans at low speed in order to reduce the noise level, but it may be impossible to provide adequate cooling at low fan speeds, even though environmental requirements related to noise levels may best be met through low fan speed operation. It should not be necessary to compromise equipment cooling for the sake of compliance with noise-emission standards. After all, lack of proper cooling can shorten component life, and the cost of system maintenance continues to mount.

It has long been recognized that temperature-proportional speed control can be accomplished through the use of pulse width modulation (PWM). There are a number of devices known in the art that provide PWM fan speed control in response to a temperature signal from an external temperature sensor.

Even though the devices currently available are capable of providing fan speed control in response to a temperature signal, these devices do not permit operational parameters to be reprogrammed easily to accommodate the thermal peculiarities of a particular chassis, nor do they allow an external controller to supervise fan management without taking over fan operation completely. These devices universally fall short of providing an adequate interface to an external control element for maximum flexibility in a wide range of applications.

SUMMARY OF THE INVENTION

These shortcomings of the prior art, and others, are addressed by the fan control system of the present invention. Computer systems typically have multiple heat sources, including the processor, power supply module, etc., which generate significant amounts of heat while the computer system is operating. Temperature rise within the computer system enclosure is significant, so fans are used to keep temperatures at an acceptable level.

Having the fans operate at maximum speed at all times is hardly an optimum solution, however. It would be desirable for the fans to run at the minimum speed appropriate for the particular temperature to minimize acoustic noise and power consumption, as well as to prolong the life of the fans used for cooling. Of course, the power consumption considerations apply primarily to portable equipment using battery power.

One or more thermal diodes may be used for temperature sensing. Use of a thermal diode is less expensive than thermistor solutions, and also potentially more accurate. The invention also includes a technique for communication with system software that increases the flexibility of the invention and renders it useful across a broad range of applications and environments.

The invention as a whole describes a PWM fan speed control circuit in which the PWM pulse width, and consequently the fan speed, varies linearly over a predefined temperature range $T_{min}$ to $T_{max}$. There are options to set a number of different values for $T_{min}$, as well as options to set the temperature range ($T_{max}-T_{min}$) by specifying the number of degrees C corresponding to each increment in pulse width.

By way of example, one can assume that fan speed is roughly linearly related to PWM duty cycle, and that the scheme provides for a linear increase in PWM duty cycle from $T_{min}$ to $T_{max}$ in a predetermined number of increments. It has been observed that fans do not operate particularly well at very low speeds, and empirical determinations support the notion that a practical minimum fan speed is about ⅓ of maximum. The proposed system accommodates about 240 speed increments, with each increment corresponding to a fraction of a degree C. For ease of implementation, only a limited number of increments would normally be permitted, say ¹⁄₁₆ of a degree C, ⅛, ¼, ½, and 1 degree. In fact, under normal circumstances, only about 160 of the speed increments are generally useful, since the first one-third (80 levels out of 240) are not used in most applications. Of course, it is always possible that a particular fan might operate satisfactorily below one-third of full speed, so there may be instances in which more of the available 240 speed increments may be used.

The range of values for $T_{min}$ can be set through an external resistive divider network. The system is capable of distinguishing among eight voltage levels. Seven of these levels correspond to discrete values of $T_{min}$, while the eighth value acts to disable automatic fan speed control entirely. The temperature increment can also be preprogrammed into the system. In the interest of simplicity, it is probably best that the increment values be restricted to power-of-two multiples of 1 degree C.

This constraint makes the mathematical manipulations very simple, since multiplication by two or powers of two can be accomplished by a simple shift operation rather than a considerably more complex floating point arithmetic operation.

Since only about 160 of the 240 discrete levels available are generally used, it is at least theoretically possible to select an increment temperature value of 1° C. with a minimum temperature of 20° C. This would mean that the max temperature would be 180° C. There is also a provision for a critical temperature to be programmed that will automatically boost the fan speed to maximum in the event that the critical temperature is ever exceeded. It should be noted that the critical temperature is another value for which external programming capability could be provided, since one would expect the critical temperature to vary considerably from chassis to chassis and depend at least to some extent on the location of the temperature sensor.

Using a somewhat qualitative analysis, it seem likely that the critical temperature could vary from about 50° C. to 100° C., for example. One possible implementation of critical temperature programming might include a default critical value of 80° C., with a system software overwrite capability for this value. One might override the default value in hardware by simply setting $T_{min}$ and the temperature increment to ensure that the fan speed will increase to full at a lower temperature value than the default critical temperature.

System software could overwrite the critical temperature and then set a lockout bit that would prevent further changes from occurring. Perhaps various levels of hardware or software reset could clear the lockout bit and allow further programming, although this is not a critical element of the invention.

In accordance with the invention, a fan speed control system for an electronic equipment enclosure is provided that comprises means for determining temperature at a plurality of locations within the enclosure, means for determining operating parameters for the fan control system, means for setting operating speed of at least one cooling fan, and means for exchanging information signals relating to fan speed control system operation with an external controller.

The means for determining temperature may comprise a plurality of temperature sensors, an analog multiplexer coupled to the temperature sensors, an A/D converter coupled to the analog multiplexer, and control logic that controls analog multiplexer channel selection and reads A/D converter output. The means for determining operating parameters for the fan control system may comprise a plurality of voltage divider networks, an analog multiplexer coupled to the voltage divider networks, an A/D converter coupled to the analog multiplexer, and control logic that controls analog multiplexer channel selection and reads A/D converter output.

In one form of the invention, the means for setting operating speed of at least one cooling fan comprises computing means associated with the control logic that computes pulse width modulation duty cycle for a fan control output signal based upon a linear interpolation of selected operating parameters. The linear interpolation of selected operating parameters is accomplished by determining a ratio between a measured operating temperature value and a predetermined range of operating temperature values, and selecting a fan control output duty cycle by applying the ratio to a range of predetermined fan control output duty cycles.

In one embodiment of the invention, the means for exchanging information signals comprises means for interconnecting data signal and clock signal information streams between the fan speed control system and the external controller to establish a serial communications bus, and serial bus interface means for managing information signal interchange.

The means for interconnecting data signal and clock signal information streams preferably comprises a dedicated data signal communication line and a dedicated clock signal communication line.

In one form of the invention, the serial bus interface means comprises means for determining a START condition on the serial communications bus, means for converting serially transmitted data signals on the data signal communication line from the external controller into parallel data signals, means for acknowledging receipt of the serially transmitted data signals from the external controller, and means for serially transmitting requested data to the external controller from the fan speed control system. The means for converting serially transmitted data signals may comprise a shift register, while the means for determining a START condition on the serial communications bus may comprise means for detecting a high-to-low logic transition on the data signal communication line while detecting a high logic state on the clock signal communication line.

In another form of the invention, a fan speed control system for an electronic equipment enclosure is provided that comprises a plurality of temperature sensors and a plurality of voltage divider networks, where the temperature sensors and voltage divider networks provide operating parameters to the fan speed control system. The system further comprises an analog multiplexer coupled to the temperature sensors and the voltage divider networks, an A/D converter coupled to the analog multiplexer, control logic that controls analog multiplexer channel selection and reads the A/D converter output, an arithmetic logic unit associated with the control logic that computes pulse width modulation duty cycle for a fan control output signal based upon a linear interpolation of selected ones of the operating parameters, and a serial bus interface that provides an interconnection over data signal and clock signal lines between the fan speed control system and an external controller.

The linear interpolation of selected operating parameters comprises determining a ratio between a measured operating temperature value and a predetermined range of operating temperature values, and selecting a fan control output duty cycle by applying the ratio to a range of predetermined fan control output duty cycles.

In accordance with one form of the invention, the serial bus interface comprises monitoring logic that detects a START condition on the serial communications bus, a shift register that converts serially transmitted data signals on the data signal communication line from the external controller into parallel data signals, a logic circuit that acknowledges receipt of the serially transmitted data signals from the external controller and a logic element that operates in conjunction with the control logic to serially transmit requested data to the external controller from the fan speed control system.

In accordance with yet another form of the invention, a method is provided for controlling fan speed for an electronic equipment enclosure. The method comprises the steps of determining temperature at a plurality of locations within the enclosure, determining operating parameters for the fan control system, setting operating speed of at least one cooling fan, and exchanging information signals relating to fan speed control system operation with an external controller.

The step of setting operating speed further comprises the step of computing pulse width modulation duty cycle for a fan control output signal based upon a linear interpolation of selected operating parameters. Preferably, the step of computing pulse width modulation duty cycle further comprises the steps of determining a ratio between a measured operating temperature value and a predetermined range of operating temperature values, and selecting a fan control output duty cycle by applying said ratio to a range of predetermined fan control output duty cycles.

In yet another aspect of the invention a method for controlling cooling fan operating speed in an electronic equipment enclosure is provided. The method comprises the steps of measuring a minimum control temperature value, determining a temperature increment value, storing the minimum control temperature value and the temperature increment value in predetermined storage registers, setting the cooling fan speed to full speed for a predetermined time period, and reading operating temperature information from a temperature sensor. If the operating temperature is less than the minimum temperature, the cooling fan is stopped. In the event that the operating temperature is greater than a predetermined critical temperature, fan operation is continued at full speed. Otherwise, a pulse width is computed for a pulse-width modulated fan control output signal based upon measured temperature, minimum temperature, and temperature increment values. The pulse width modulated fan control output signal is then applied to the cooling fan to control its operating speed.

The step of determining a temperature increment value may comprise reading the temperature increment value from a predetermined one of the storage registers, or reading an output voltage from an external voltage divider network.

In still another aspect of the invention, the method may further comprise the steps of determining a device address for the fan speed control system, monitoring serial data and clock information signals from an external controller, determining whether a START condition has occurred, comparing a received device address to the device address for the fan control system and determining if there is a match, and if a match occurs, acknowledging the received device address, and responding to further received data signals as required.

Further objects, features, and advantages of the present invention will become apparent from the following description and drawings.

BRIEF DESCRIPTION OF THE DRAWINGS

FIG. 3 depicts a table of resistor values for programming selected parameters;

DETAILED DESCRIPTION OF THE INVENTION

Figure 1:
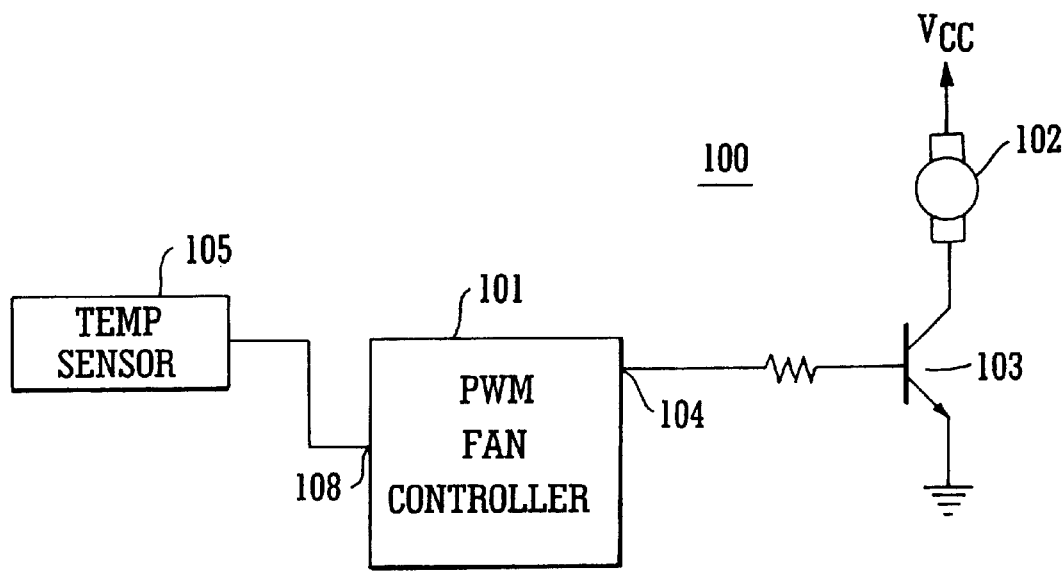
FIG. 1 is a block diagram representation of a fan speed control device of the prior art.

In accordance with the present invention, a fan speed control system is described that provides distinct advantages when compared to those of the prior art. FIG. 1 illustrates a fan control system well known in the prior art, generally depicted by the numeral 100. A pulse-width modulation (PWM) controller integrated circuit (IC) 101 has as its primary control input a signal from a temperature sensor 105, that is received over input signal line 108. The temperature sensor 105 may be an appropriately biased thermistor, for example, selected to have a known resistance at a predetermined reference temperature (25° C., for example). Of course, even though the present system utilizes temperature information for fan speed control purposes, it would also be possible to use other operating parameters, such as, for example, air flow at selected locations within an equipment enclosure. Air flow velocity information could readily be represented by a varying voltage.

It is well-known that there is a linear relationship between the duty cycle of the fan drive pulse train appearing at the fan controller output 104 and the speed of the DC fan 102. The duty cycle of this drive voltage at the output 104 is applied to the base of a transistor 103 in the ground side of the fan 102 circuit. Thus, the drive signal duty cycle directly affects the average current of the fan 102, and hence its speed. Although not illustrated in the drawing figure, secondary inputs to the fan controller 101 can be used to place the circuit in an override mode, where the fan 103 would be operated at full speed at all times.

Since the fan speed is essentially controlled by the voltage at the input signal line 108, it has been suggested that this control voltage could be supplied by an external microcontroller using a small subset of available general purpose input/output (GPIO) lines and a relatively crude A/D (analog-to-digital) converter of the R/2R ladder variety, for example, although this configuration is not shown in the drawing. Using this technique, a predetermined voltage level can be provided to the fan controller 101, directly controlling the fan speed. Of course, the external microcontroller or other peripheral would have to take over the temperature monitoring task, if this sort of functionality were deemed desirable.

Figure 2:
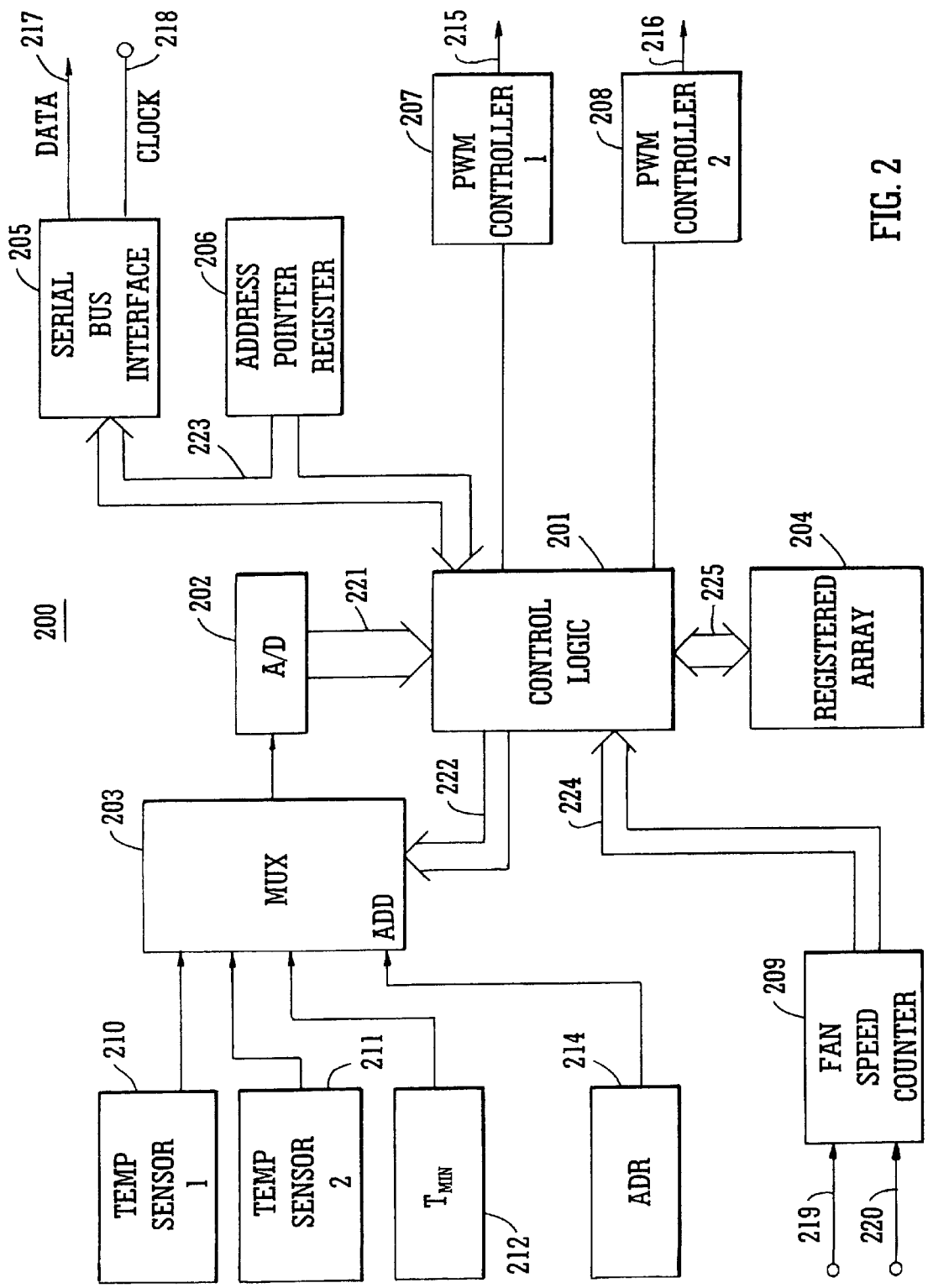
FIG. 2 is a block diagram depiction of a fan speed control system in accordance with the present invention.

FIG. 2 depicts a fan speed control system in accordance with the present invention, in block diagram form, as generally depicted by the numeral 200. At the heart of the system 200 is a hard-wired PWM logic controller 201 that provides local control of system operation. The control logic 201 may be a state machine controller, a microprogrammed processor element, or other suitable control logic arrangement that will perform a predetermined sequence of operations upon power-up and respond to external stimuli as appropriate. Although pulse-width modulation is the manner in which fan speed is controlled in the preferred embodiment, it would also be possible to provide a continuously variable voltage drive signal for conventional cooling fans that do not operate using PWM.

A number of input signals are read during the power-up sequence (which will be described in greater detail subsequently) with the aid of an input multiplexer 203 and analog-to-digital converter (A/D) 202. The system 200 will accommodate a plurality of temperature sensors (two in the preferred form of the invention) 210–211, and will drive two fan outputs 215–216 through pulse-width modulator (PWM) controllers 207–208. Since up to eight individual controllers 200 can be employed simultaneously, in a fashion to be described below, up to sixteen fans can be controlled. This arrangement is ideal for high-end file servers, which often require extensive forced-air cooling.

The temperature sensors 210–211 are preferably of the thermal diode type. Thermal diodes are relatively inexpensive to manufacture, particularly since they can be implemented with ease on an integrated circuit die, and hence provide on-the-spot information about the operating temperature of a particular device. Although the ancillary circuitry necessary to accomplish the proper interface with thermal diode sensors is not illustrated in the figure, it is well known that the accuracy of thermal diode temperature readings can be enhanced by taking voltage readings at two distinct current levels. The system 200 is equipped to handle such measurement requirements. On the other hand, the temperature sensors 210–211 may be of the conventional thermistor type.

In any event, measurement of output voltages from the temperature sensors 210–211 is readily accomplished by the expedient of having the control logic 201 select the proper channel for the multiplexer 203, then read the A/D converter 202. The voltage corresponding to each temperature measurement is then stored in an associated register array 204. The register array 204 is simply a collection of memory locations, each with its unique eight-bit address.

Other voltage levels that are sampled by the control logic 201 include the minimum temperature value, $T_{min}$ 212, and the device address value ADR 214. Preferably, these values are only sampled once, and that occurs during the power-up sequence.

The device address ADR 214 is used for communication with the system 200 via serial bus interface 205, which will be described in more detail below. The system 200 is connected to the serial bus over DATA and CLOCK communication lines 217, 218 as a slave device, under control of a master device.

Figure 4:
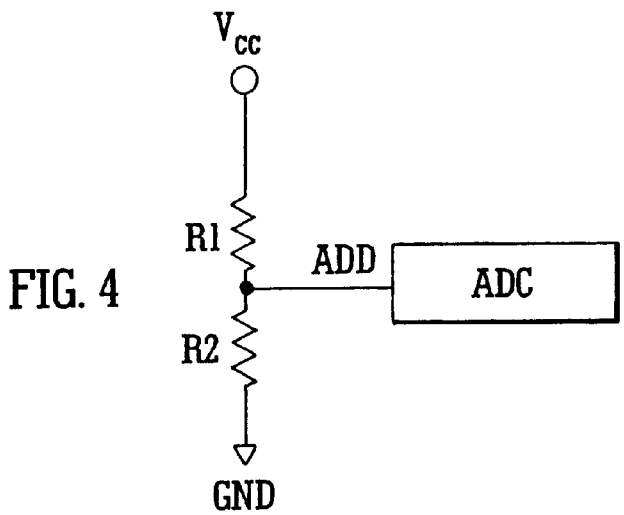
FIG. 4 illustrates a resistive voltage divider configuration suitable for use with the present invention.
Figure 5:
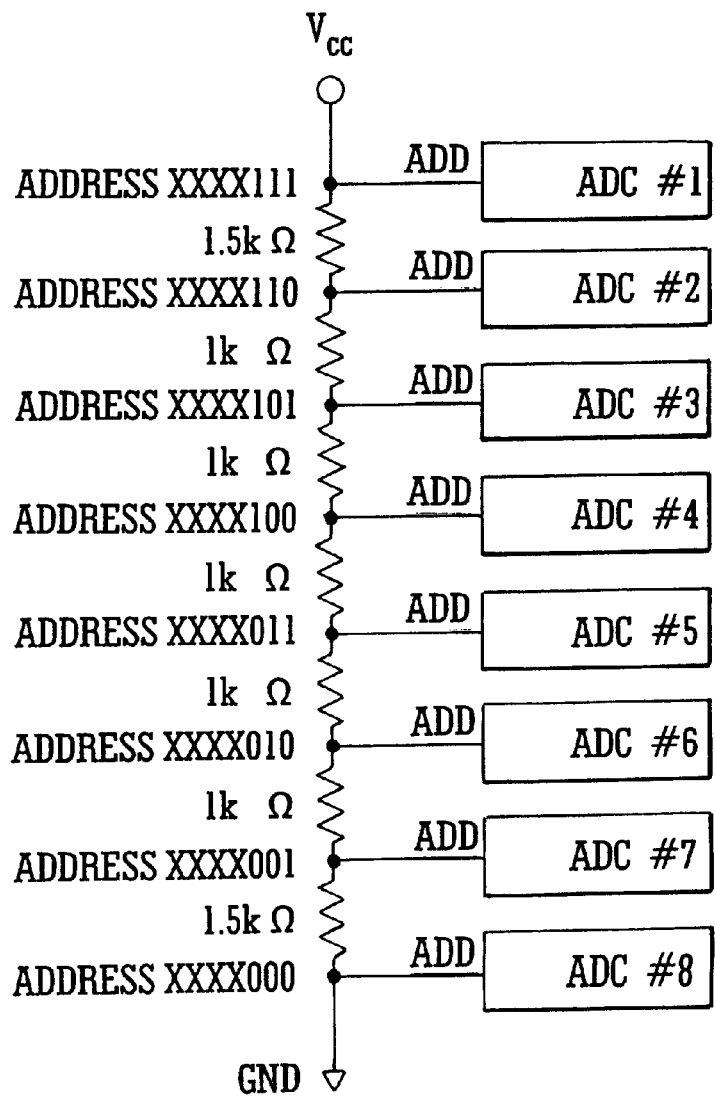
FIG. 5 shows a potential divider suitable for programming device addresses for multiple systems.

The system 200 has a 7-bit serial bus address ADR 214. The four most significant bits (MSBs) can be hard-wired to 0101, for example. The three least significant bits (LSBs) can be set by the user to give a total of eight different addresses, allowing up to eight systems to be connected to the same serial communications bus structure. To minimize device pin count and size, the three LSBs are set using a single pin ADD of the device package. The input voltage on this device pin is sampled immediately after power-up through the multiplexer 203 and the analog-to-digital converter 202. The voltage level is set by a voltage divider as illustrated in FIG. 4.

FIG. 3 shows suitable values for R1 and R2 for setting the three LSBs of the serial bus address. The same principle is used to select the value of $T_{min}$ 212 through another pin of the device package and a different channel of the multiplexer 203. If a number of fan speed control systems 200 are used within a single enclosure, for example, their device address inputs can tap off a single potential divider, as illustrated in FIG. 4.

In order to guarantee maximum accuracy in the determination of device addresses, the measurement range of the A/D converter is divided into eight equal segments or bands, and the resistor values are selected to place each of the ideal voltage inputs precisely in the middle of each band, thus providing the best noise immunity. This selection of appropriate resistor values is expressed in the second column of the table of FIG. 3 as an ideal voltage division ratio.

Of course, from a practical standpoint, the resistor values used to program the device addresses should be readily available. In columns three and four of FIG. 3, values of R1 and R2 are tabulated using values that are easily obtainable commercially. The actual resulting ratios and errors expressed in terms of deviation from ideal are shown in columns five and six of FIG. 3. One percent tolerance resistors are preferably used for best accuracy.

As mentioned previously, information relating to the minimum temperature $T_{min}$ and certain other device parameters is programmed through a dedicated voltage divider network 212 using the same resistor scheme just described. If the value of R1 is selected as 0 ohms (the corresponding device input is strapped to Vcc), automatic fan speed control is disabled, and the number of fans is set to 2. If R2 is set to 0 ohms (the device input is strapped to ground), automatic fan speed control is disabled, and the number of fans is set. As shown in the table, for selected resistor values, the minimum temperature of automatic speed control operation can be selected as 32, 40 or 48° C., for 1 or 2 fans installed. As noted above, device address is selected by the voltage divider at the ADD input to the device, and is not affected by the programming of $T_{min}$.

The $T_{min}$ voltage level is programmed with the operating environment of the fan control system in mind. $T_{min}$ is the temperature below which the control logic turns off the cooling fans.

The device address input voltage ADR 214 establishes the address at which the fan controller 200 can be accessed by an external device. The range from zero volts to supply voltage is divided into eight segments, and the voltage produced by the ADR voltage divider network 214 is selected to correspond to one of these ranges. This address assignment capability is designed to provide the eight unique addresses that are necessary to allow an external device to communicate with eight fan controller systems whose serial communications lines 217–218 are connected together in a serial bus structure. The serial communication protocol is dealt with in more detail in a subsequent section.

The fan control system 200 also has the capability to monitor the speed of the fans to which it is connected. This is accomplished by counting fan pulses through a fan speed counter 209. Each fan to which the system 200 is connected has its own speed monitoring input 219–220 to the fan counter 209, and the fan counter 209 is preferably a dual counter implementation to support data gathering from two fans. The control logic 201 reads and stores the fan speed values in registers of the array 201 for possible access by an external device, and also uses the speed values to determine whether a fault condition exists.

The PWM controllers 207–208, one for each fan, provide pulse trains whose duty cycles are linearly related to temperature, provided that the sensed temperature is within the control range of the system. The control range is nominally between the minimum temperature $T_{min}$ and the critical temperature. The critical temperature is preprogrammed into the device (each fan subsystem has its own critical temperature) and stored in registers within the register array so that the values can be modified by the external control element via serial communication.

Due to electromechanical considerations associated with the brushless DC fans normally used in PWM applications, the minimum fan speed is about one-third of full speed. To arrive at the appropriate fan speed for a given temperature, there are a number of possible methods. One technique allows for 160 fan drive duty cycles ranging from about 33% to 100%. For example, for a temperature step of 1° C. and a minimum temperature of 20° C., the fan would be stopped at a temperature below 20°, would gradually increase speed (linearly with temperature) from 20° to 180°, and would be at full speed at 180° and above. Whenever a change in temperature is detected, the fan speed is adjusted accordingly through alteration of the output pulse train duty cycle.

Figure 7:
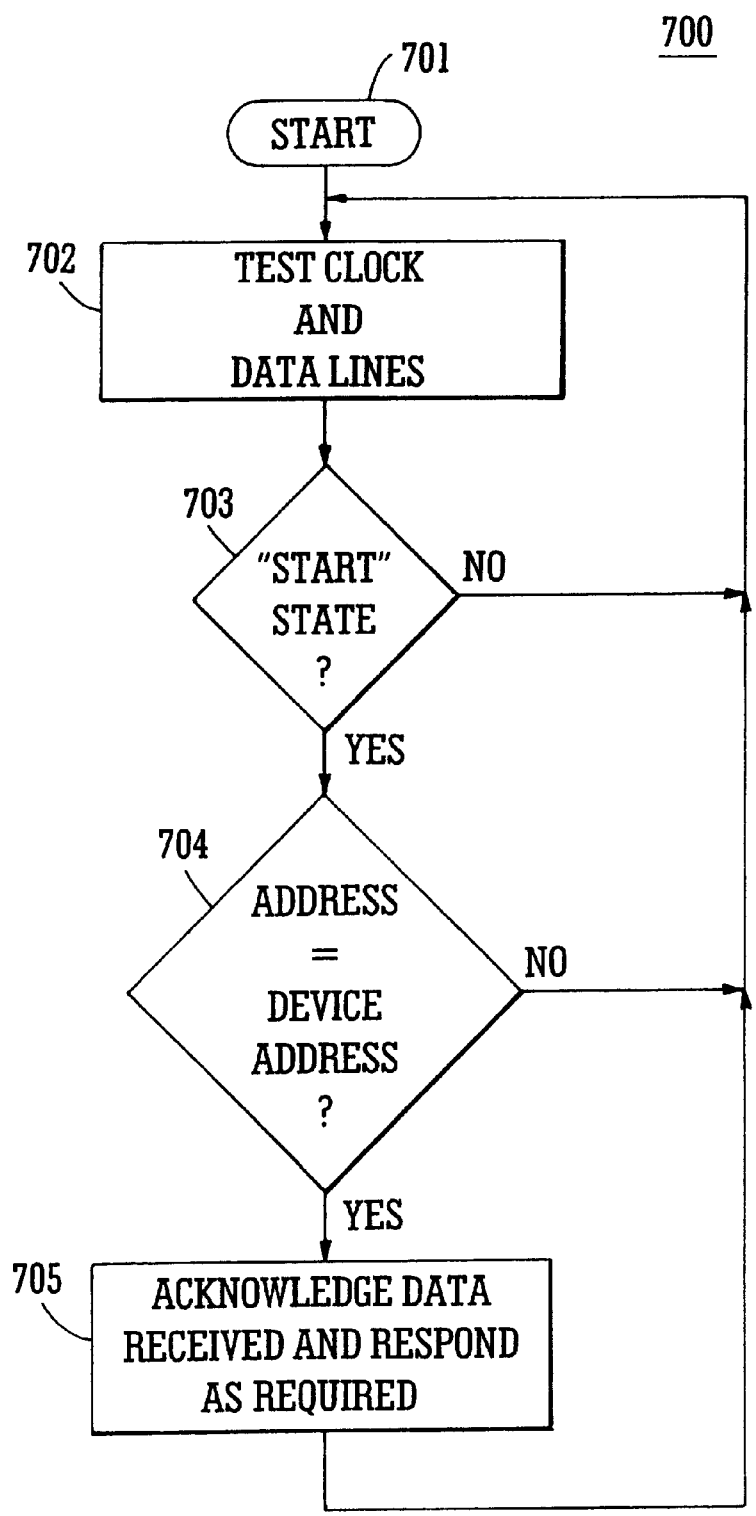
FIG. 7 is a flow chart illustrating a communication protocol in accordance with the present invention.

As mentioned briefly above, the system 200 is capable of communication with an external device over a serial communication interface. The communication signals are transmitted over a serial data line 217 in conjunction with a clock signal 218. The serial bus interface 205 monitors the data and clock lines 217–218. FIG. 7 is a flow chart 700 describing the serial communication protocol. As mentioned, the clock and data lines 217–218 are monitored in step 702 by the serial bus interface 205 until a START state is detected (703). In the preferred embodiment, the START state occurs on the serial bus when a high-to-low transition on the data line 217 is detected while the clock line 218 remains in a high logic state. Of course, other signal states could be selected to signal a START condition.

Once the START condition has been verified, eight data bits are shifted into the serial bus interface 205. These first eight data bits following the START state correspond to a device address plus a Read/Write (R/W) bit. Since the address of the particular fan speed control system 200 has already been read from the ADR voltage divider network 214 and stored in the appropriate register in the register array 204, the control logic can determine whether fan control device 200 is being addressed by the external control element. If there is no address match (step 704), subsequent data bytes are ignored, and the serial bus interface 205 goes back to monitoring the serial data and clock lines in step 702.

If an address match is detected, the serial bus interface proceeds to acknowledge the transmitted data by pulling the data line 217 low briefly, and responding as transmitted data indicate (step 705). The way the communication protocol is preferably structured, the date, byte following the device address is an internal register address (if the operation is a write operation as defined by the transmitted R/W bit).

If a write operation is indeed in progress, the data byte is interpreted as an internal register address identifying one of the registers in the register array 204 to which the external control element wishes to write data. This register identification information is stored in the address pointer register 206. Again, in the event that a write operation is in progress, there may be a subsequent data byte that the control logic will cause to be written to the addressed register.

As part of the serial protocol, a simple read operation is also permitted in which a register address need not be specified. If the external control element already knows the contents of the address pointer register 206, there is no need to send it again, and the contents of the register addressed are simply shifted out on the serial bus by the control logic 201 through the serial bus interface 205. Write operations to the fan control system 200 are not permitted unless the register address is explicitly transmitted as part of the data stream sent by the controller.

Figure 6:
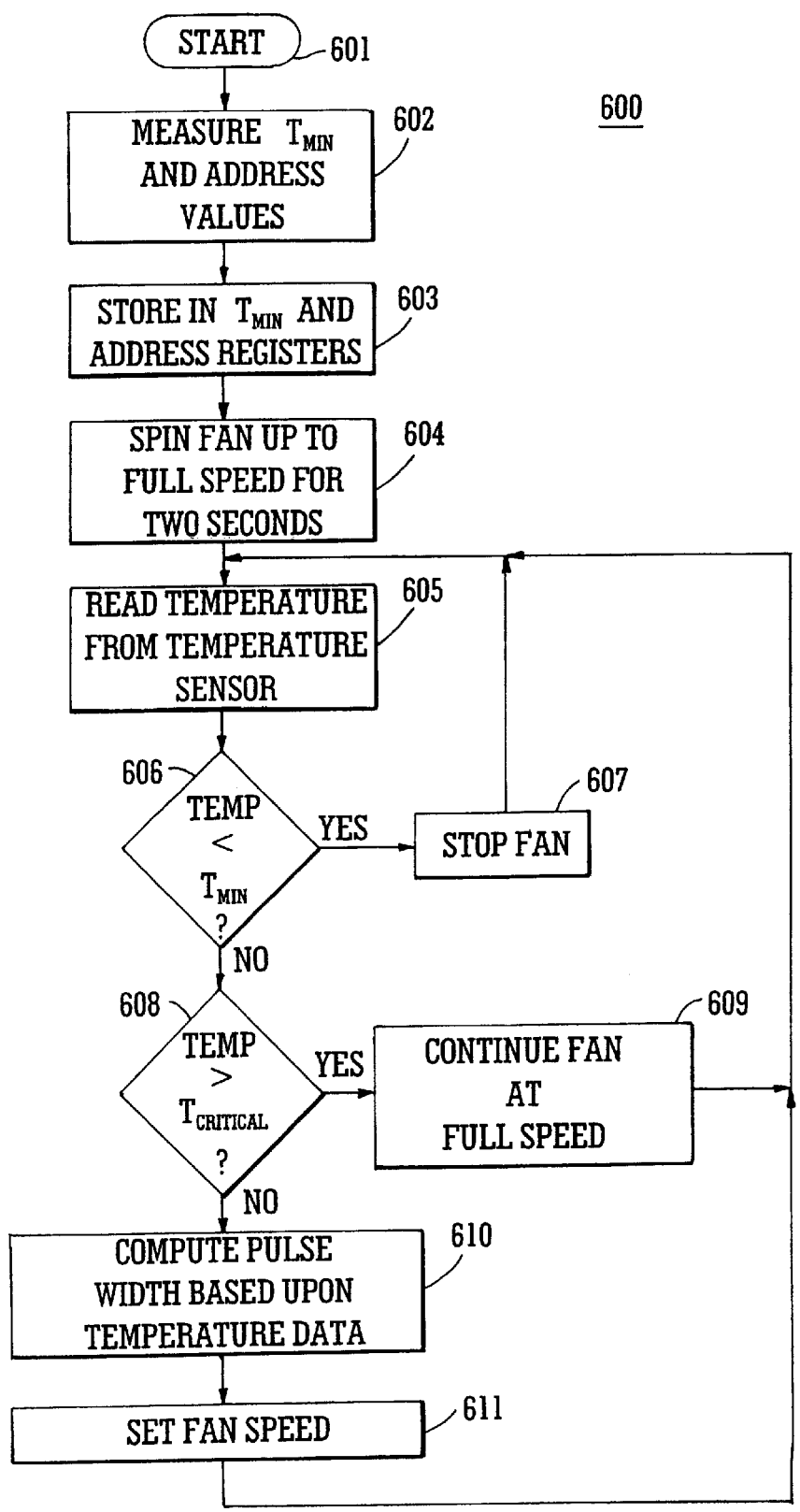
FIG. 6 is a flow chart of the operating sequence of the fan speed control system of FIG. 2.

The power-up sequence for a fan control system in accordance with the present invention is illustrated in flow chart form (and depicted by the numeral 600) in FIG. 6. Immediately after power-on reset (generated by an on-chip network that is not shown in FIG. 2 in response to the application of power to the device, or generated by a dedicated RESET input), the voltage levels designating $T_{min}$ and device address ADR are read (step 602).

In any event, after these parameters are measured and stored in the appropriate locations in the register array in accordance with step 603, both fans are spun up to full speed for a period of two seconds in the subsequent operation 604. Temperature information is then read from each temperature sensor (step 605).

If the sensed temperature is less than the minimum temperature value (step 606), the corresponding cooling fan is simply stopped (step 607). If the measured temperature exceed the critical temperature (step 608), the corresponding fan is allowed to continue full speed operation (step 609). Otherwise, in the subsequent operation 610, pulse width (or duty cycle, if you will) is computed for each fan based upon the measured temperature), and the fan speed is set accordingly (step 611). Temperature information is then read again in step 605. It, should be noted that the monitoring period (how often temperature data is measured) is preferably programmable via a register in the register array that can be overwritten by an external control device over the serial interface.

Since each individual fan speed control system has the capability to control two fans, and to measure temperature both from an internal temperature sensor and from two external temperature inputs. Preferably, the system is flexible enough to permit any of the temperature control inputs to control any or all of the fans. In fact, in the inventive system, by appropriate programming of control registers within the register array, it is possible to have more than one of temperature sensor control a single fan. In the event that this mode of operation is selected, the temperature sensor that senses the highest temperature takes priority, and the fan speed is set in accordance with the temperature measured by that measurement channel.

As a practical matter, the automatic fan speed control mode of operation varies the speed of the controlled fan over a linear range beginning at $T_{min}$ and ending at $T_{min}$+ RANGE, where RANGE is programmable by writing to the device register array. Preferably, the temperature range values are selected from among the values 10, 20, 40, 80 and 160° C. The temperature at which fan speed reaches 100 percent is the maximum temperature determined by $T_{min}$+ RANGE.

Figure 8:
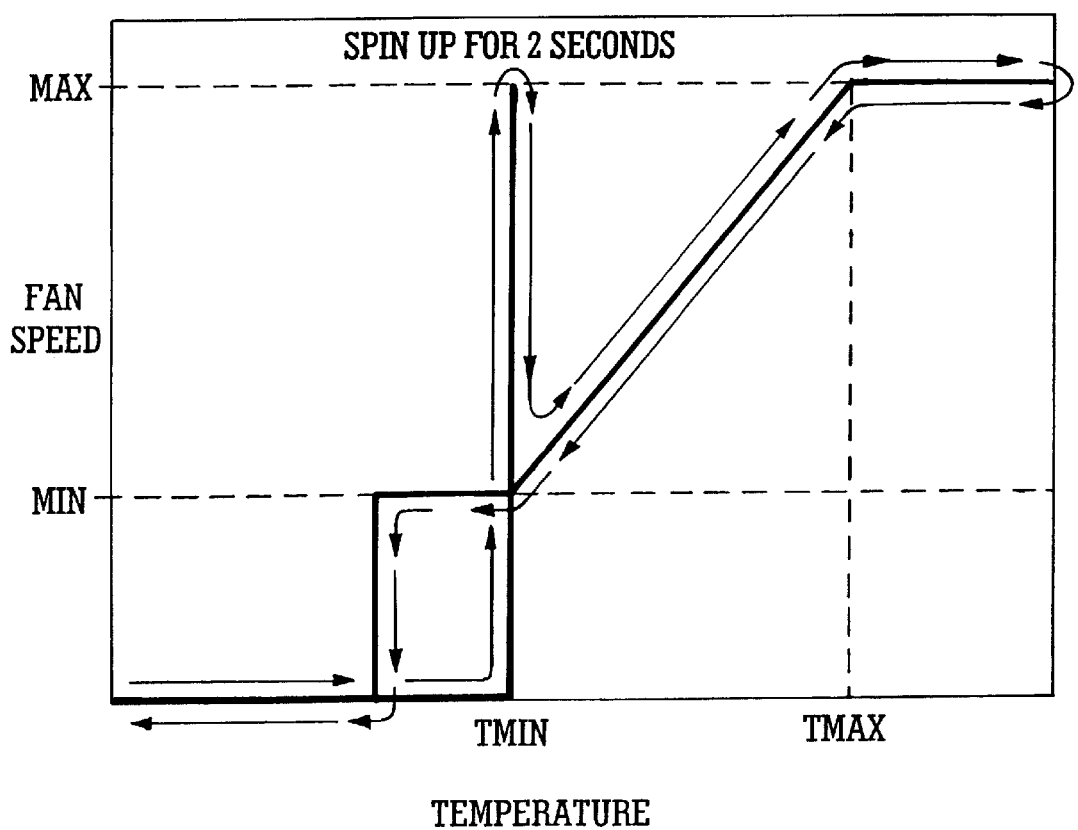
FIG. 8 illustrates the automatic fan speed control transfer function in accordance with the present invention.

FIG. 8 depicts the transfer function of the fan speed control system in automatic fan speed control mode of operation. Upon power-up, as described previously, the fans are spun up to maximum speed for two seconds. The maximum fan speed value is programmable, so that maximum fan speed need not correspond to 100% duty cycle of the PWM output signal. After two seconds have elapsed, the fan speed is set by measurement of the temperature that is programmed to control the particular fan.

If the measured temperature is below $T_{min}$, the fan is turned off. As temperature increases above $T_{min}$, the fan speed is varied linearly between the programmed minimum fan speed (default one-third of maximum, or a 33% PWM duty cycle) to the programmed maximum fan speed. Under ordinary circumstances, the measured temperature value will fall in response to the increased cooling produced by higher fan speed.

The fan will not necessarily turn off as the temperature drops below $T_{min}$, however. The system permits programming of a hysteresis value between 0° and 15° C. this prevents the fan from cycling on and off continuously in the region right around $T_{min}$.

As mentioned in a preceding discussion, the fan control system also permits programming of alarm conditions that will override the selection of automatic fan speed control mode and cause the fans to run at full speed. An example of these alarm conditions is an overtemperature indication. The alarm temperature is also programmable by writing to the appropriate control register in the register array.

Although the device is capable of altering a variety of operating parameters through its serial communication capability, the fan speed control system described is also capable of highly independent operation. Without any supervision by an external control device, the fan speed control system of the present invention will provide fully automatic control of associated cooling fans in response to measured temperature values, and will also respond appropriately to alarm conditions. If a hot spot within an equipment enclosure were to be detected through an elevated temperature reading at one of its associated temperature sensors, the fan speed control system can respond by speeding up its fans to full speed, as well as by generating an interrupt to signal an associated master control system.

Figure 9:
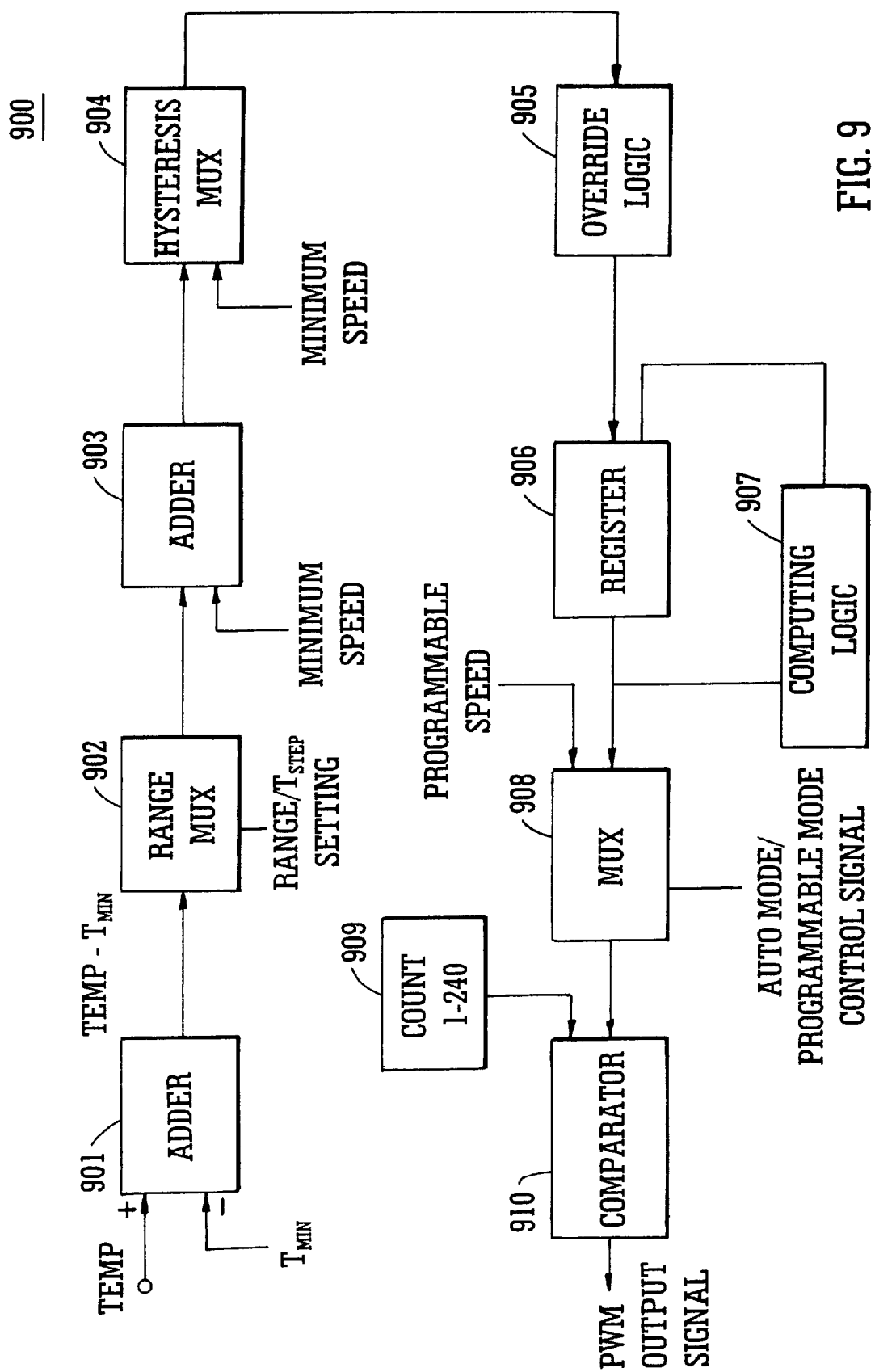
FIG. 9 is a block diagram illustrating various modes of operation of an automatic fan speed control system in accordance with the present invention.

FIG. 9 provides a block diagram view (generally depicted by the numeral 900) of the operation of the fan speed control system. The parameters depicted in FIG. 9 have previously been described.

It is helpful in attaining an overall understanding of system operation to consider that the programmed parameter $T_{min}$ is subtracted from the measured temperature TEMP in an adder 901, with the difference TEMP - $T_{min}$ being provided to a range multiplexer 902 that is controlled by a RANGE/$T_{step}$ control signal. This multiplexer 902 affects the way in which the fan speed value is computed. In the RANGE mode, the fan speed is determined by a linear interpolation over a range of values extended from $T_{min}$ to $T_{min}$+RANGE. On the other hand, in the $T_{step}$ mode, the relevant temperature grange extends from $T_{min}$ to the critical temperature, $T_{CRITICAL}$, in steps of $T_{step}$ degrees.

The output of the range multiplexer 902 is provided to an adder 903 where it is added to a value corresponding to minimum speed of fan operation. As mentioned previously, the minimum speed of fan operation is generally about one-third of full fan speed, but this minimum speed value can be reprogrammed over the serial communication interface and stored in the register array. There are independently programmable minimum speed values for each fan supported by the fan speed control system.

The output from the adder 903 is passed along to a hysteresis multiplexer 904. The hysteresis multiplexer controls the hysteresis that is built into the automatic control transfer function of the system, as discussed above. The hysteresis value is programmable, and prevents the cooling fans from cycling on and off in the region of the minimum temperature, $T_{min}$.

Override logic 905 is interposed after the hysteresis multiplexer 904. The override logic has the capability to override the calculated fan speed value based upon the occurrence of a critical event, such as the measured temperature TEMP exceeding the critical temperature $T_{CRITICAL}$. The override logic 905 controls the placement of the fan speed value into a register 906. Computing logic 907 operates in conjunction with the register 906 to calculate maximum fan speed across the three measurement channels available. It should be recalled from prior description that temperature information is available to the system from an internal temperature sensor and two external sensors. Any of these values can control the speed of operation of either of the two associated fans, and this control protocol is determined through programmable control words stored in the associated register array.

The register 906 output is then provided to a final speed control multiplexer 908. This multiplexer 908 is controlled by an AUTO MODE/PROGRAMMABLE MODE control signal. In AUTO MODE, the speed value based upon linear interpolation is provided to the subsequent comparator stage 910. In PROGRAMMABLE MODE, a programmed speed value from the appropriate location in the register array is provided to the comparator 910. The speed value at the comparator 910 is clocked out as a pulse width modulation PWM output signal by counter 909 to provide a PWM output signal at the proper frequency and duty cycle.

There has been described herein a fan speed control system which is improved over the prior art. It will be apparent to those skilled in the art that modifications may be made without departing from the spirit and scope of the invention. Accordingly, it is not intended that the invention be limited except as may be necessary in view of the appended claims.

What is claimed is:

1. A fan speed control system for an electronic equipment enclosure comprising:
    means for determining temperature at a plurality of locations within the enclosure;
    means for determining operating parameters for the fan control system;
    means for setting operating speed of at least one cooling fan; and
    means for exchanging information signals relating to fan speed control system operation with an external controller.

2. The fan speed control system of claim 1, wherein the means for determining temperature comprises:
    a plurality of temperature sensors;
    an analog multiplexer coupled to the temperature sensors;
    an A/D converter coupled to the analog multiplexer; and
    control logic that controls analog multiplexer channel selection and reads A/D converter output.

3. The fan speed control system of claim 1, wherein the means for determining operating parameters for the fan speed control system comprises:
    a plurality of voltage divider networks;
    an analog multiplexer coupled to the voltage divider networks;
    an A/D converter coupled to the analog multiplexer; and
    control logic that controls analog multiplexer channel selection and reads A/D converter output.

4. The fan speed control system of claim 3, wherein the voltage divider networks comprise resistive voltage divider networks.

5. The fan speed control system of claim 4, wherein the resistive voltage divider networks include a plurality of series-connected resistors disposed between a regulated supply voltage and ground potential.

6. The fan speed control system of claim 5, wherein resistor values are selected to produce one of a set of eight pre-determined voltages at each tap between two consecutive series-connected resistors.

7. The fan speed control system of claim 1, wherein the means for setting operating speed of at least one cooling fan comprises:
computing means associated with the control logic that computes pulse width modulation duty cycle for a fan control output signal based upon a linear interpolation of selected operating parameters.

8. The fan speed control system of claim 7, wherein the linear interpolation of selected operating parameters comprises:
determining a ratio between a measured operating temperature value and a predetermined range of operating temperature values; and
selecting a fan control output duty cycle by applying said ratio to a range of predetermined fan control output duty cycles.

9. The fan speed control system of claim 1, wherein the means for exchanging information signals comprises:
means for interconnecting data signal and clock signal information streams between the fan speed control system and the external controller to establish a serial communications bus; and
serial bus interface means for managing information signal interchange.

10. The fan speed control system of claim 9, wherein the means for interconnecting data signal and clock signal information streams comprises a dedicated data signal communication line and a dedicated clock signal communication line.

11. The fan speed control system of claim 9, wherein the serial bus interface means comprises:
means for determining a START condition on the serial communications bus;
means for converting serially transmitted data signals on the data signal communication line from the external controller into parallel data signals;
means for acknowledging receipt of the serially transmitted data signals from the external controller; and
means for serially transmitting requested data to the external controller from the fan speed control system.

12. The fan speed control system of claim 11, wherein the means for converting serially transmitted data signals comprises a shift register.

13. The fan speed control system of claim 11, wherein the means for determining a START condition on the serial communications bus comprises means for detecting a high-to-low logic transition on the data signal communication line while detecting a high logic state on the clock signal, communication line.

14. A fan speed control system for an electronic equipment enclosure comprising:
a plurality of temperature sensors;
a plurality of voltage divider networks;
wherein the temperature sensors and voltage divider networks provide operating parameters to the fan speed control system;
an analog multiplexer coupled to the temperature sensors and the voltage divider networks;
an A/D converter coupled to the analog multiplexer;
control logic that controls analog multiplexer channel selection and reads the A/D converter output;
an arithmetic logic unit associated with the control logic that computes pulse width modulation duty cycle for a fan control output signal based upon a linear interpolation of selected ones of the operating parameters; and
a serial bus interface that provides an interconnection over data signal and clock signal lines between the fan speed control system and an external controller.

15. The fan speed control system of claim 14, wherein the linear interpolation of selected operating parameters comprises:
determining a ratio between a measured operating temperature value and a predetermined range of operating temperature values; and
selecting a fan control output duty cycle by applying said ratio to a range of predetermined fan control output duty cycles.

16. The fan speed control system of claim 14, wherein the serial bus interface comprises:
monitoring logic that detects a START condition on the serial communications bus;
a shift register that converts serially transmitted data signals on the data signal communication line from the external controller into parallel data signals;
a logic circuit that acknowledges receipt of the serially transmitted data signals from the external controller; and
a logic element that operates in conjunction with the control logic to serially transmit requested data to the external controller from the fan speed control system.

17. A method for controlling fan speed for an electronic equipment enclosure, the method comprising the steps of:
(a) determining temperature at a plurality of locations within the enclosure;
(b) determining operating parameters for the fan control system;
(c) setting operating speed of at least one cooling fan; and
(d) exchanging information signals relating to fan speed control system operation with an external controller.

18. The method in accordance with claim 17, wherein the step of setting operating speed further comprises the step of:
computing pulse width modulation duty cycle for a fan control output signal based upon a linear interpolation of selected operating parameters.

19. The method in accordance with claim 18, wherein the step of computing pulse width modulation duty cycle further comprises the steps of:
(a) determining a ratio between a measured operating temperature value and a predetermined range of operating temperature values; and
(b) selecting a fan control output duty cycle by applying said ratio to a range of predetermined fan control output duty cycles.

20. A method for controlling cooling fan operating speed in an electronic equipment enclosure, the method comprising the steps of:
(a) measuring a minimum control temperature value;
(b) determining a temperature increment value;
(c) storing the minimum control temperature value and the temperature increment value in predetermined storage registers;
(d) setting the cooling fan speed to full speed for a predetermined time period;

(e) reading operating temperature information from a temperature sensor;

(f) if the operating temperature is less than the minimum temperature, stopping the cooling fan;

(g) if the operating temperature is greater than a predetermined critical temperature, continuing to operate the cooling fan at full speed;

(h) otherwise, computing a pulse width for a pulse-width modulated fan control output signal based upon measured temperature, minimum temperature, and temperature increment values; and (i) applying the pulse width modulated fan control output signal to the cooling fan to control its operating speed.

21. The method in accordance with claim 20, wherein the step of determining a temperature increment value comprises reading the temperature increment value from a predetermined one of the storage registers.

22. The method in accordance with claim 20, wherein the step of determining a temperature increment value comprises reading an output voltage from an external voltage divider network.

23. The method in accordance with claim 20, further comprising the steps of:

(a) determining a device address for the fan speed control system;

(b) monitoring serial data and clock information signals from an external controller;

(c) determining whether a START condition has occurred;

(d) comparing a received device address to the device address for the fan control system and determining if there is a match; and (e) if a match occurs, acknowledging the received device address, and responding to further received data signals as required.

* * * * *